United States Patent
Rider et al.

(10) Patent No.: US 6,265,915 B1
(45) Date of Patent: Jul. 24, 2001

(54) OUTPUT EDGE CONTROL CIRCUIT

(75) Inventors: Nathan T. Rider, Groton, MA (US); James C. Spurlin, Sherman, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/490,806

(22) Filed: Jan. 26, 2000

Related U.S. Application Data

(60) Provisional application No. 60/119,045, filed on Feb. 8, 1999.

(51) Int. Cl.$^7$ .................................................. H03B 1/00
(52) U.S. Cl. ........................ 327/112; 327/387; 327/391; 327/427; 326/27; 326/87
(58) Field of Search ...................... 327/108, 109–112, 327/379–381, 384, 385, 387, 389, 391, 427, 434; 326/26, 27, 82–87; 307/412; 365/189.05

(56) References Cited

U.S. PATENT DOCUMENTS 5,841,702 * 11/1998 Kim ............................... 365/189.05
6,137,322 * 10/2000 Ten Eych .......................... 327/112

* cited by examiner

*Primary Examiner*—Timothy P. Callahan
*Assistant Examiner*—Minh Nguyen
(74) *Attorney, Agent, or Firm*—Alan K. Stewart; Wade James Brady, III; Frederick J. Telecky, Jr.

(57) ABSTRACT

The output edge control circuit includes: a high side transistor 27 coupled to an output node 44; a first low side transistor 20 coupled to the output node 44; a second low side transistor 24 coupled in parallel with the first low side transistor 20; a coupling transistor 23 coupled between the output node 44 and a control node of the second low side transistor 24; a transmission gate 50 coupled between a control node of the first low side transistor 20 and a control node of the coupling transistor 23; and feedback circuitry 58 coupled between the output node 44 and the transmission gate 50 for controlling the transmission gate 50.

13 Claims, 1 Drawing Sheet

OUTPUT EDGE CONTROL CIRCUIT

This application claims priority under 35 USC §119(e)(1) of provisional application No. 60/119,045, filed Feb. 8, 1999.

FIELD OF THE INVENTION

This invention generally relates to electronic systems and in particular it relates to output control circuits.

BACKGROUND OF THE INVENTION

In almost all CMOS output circuits output ringing due to large amounts of current into ground is a common problem. This phenomenon is most evident during conditions where all or many outputs are switched at once. There have been many types of edge control circuitry introduced in order to deal with this problem. However the trade off for edge control is usually a loss in speed.

SUMMARY OF THE INVENTION

The output edge control circuit includes: a high side transistor coupled to an output node; a first low side transistor coupled to the output node; a second low side transistor coupled in parallel with the first low side transistor; a coupling transistor coupled between the output node and a control node of the second low side transistor; a transmission gate coupled between a control node of the first low side transistor and a control node of the coupling transistor; and feedback circuitry coupled between the output node and the transmission gate for controlling the transmission gate.

DESCRIPTION OF PREFERRED EMBODIMENTS

Figure 1:
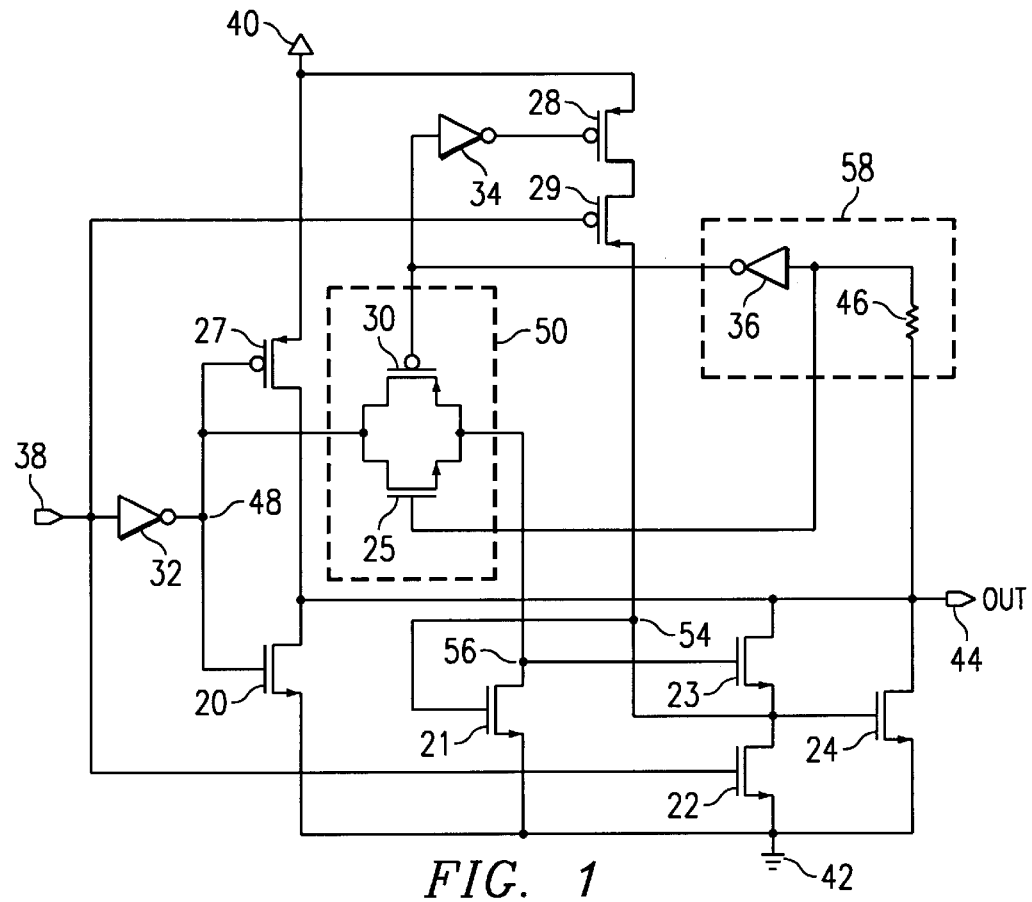
FIG. 1 is a schematic circuit diagram of a preferred embodiment output edge control circuit.

FIG. 1 shows a preferred embodiment output circuit which minimizes ground bounce and undershoot utilizing a feedback loop to vary the drive strength. The circuit of FIG. 1 includes NMOS transistors 20–25, PMOS transistors 27–30, inverters 32, 34, and 36, input node 38, voltage supply node 40, ground 42, output node 44, and resistor 46. The circuit of FIG. 1 uses a feedback loop to control a coupling action between the gate of the lower output transistor and the output. The coupling allows the pull down strength to decrease as the output falls, thus reducing the undershoot when the output reaches the low level. This characteristic allows the output to reach the threshold region quickly while minimizing the oscillation when the output reaches the low level.

The main function of the circuit of FIG. 1 is edge control on the high to low transition of the output at node 44. Transistors 20 and 24 are the output pull down transistors (low side transistors). When the voltage on input node 38 goes from high to low, node 48 transitions to a high voltage. This immediately turns on transistor 20 to start the high to low transition of the output voltage at node 44. Transistor 20 is sized smaller than transistor 24 to reduce the rate of change of current during the initial transition, thus reducing switching noise. The high voltage at node 48 also sets a high input to transmission gate 50 formed by transistors 25 and 30. Since the output at node 44 was initially in a high state, the feedback path 58, composed of resistor 46 and inverter 36, allows the transmission gate 50 to be in the transfer mode. Therefore, a high is passed through the transmission gate 50, this high turns on transistor 23, thus coupling the gate (control node) of transistor 24 to output node 44 which is high. This turns on transistor 24. At this point, transistors 20 and 24 are pulling down the output at node 44. But as the voltage on output node 44 falls, the coupling between the gate of transistor 24 and the output node 44 becomes less effective, i.e., the output impedance increases, and the edge-rate is slowed, thus reducing ringing and undershoot. As the output falls, the feedback path 58 toggles the transmission gate 50 to the blocking mode, thus removing the drive for transistor 23. Simultaneously it turns on transistor 28 and places a steady high on the gate of transistor 24, by coupling the supply voltage from node 40 instead of the output voltage at node 44 to the gate of transistor 24. The high voltage on node 54 turns on transistor 21, discharging node 56 and preventing a floating gate at transistor 23. This turns off transistor 23 which eliminates the output coupling. Now the transition is over and transistors 20 and 24 are at minimum impedance, holding output node 44 in a low voltage state, with high current drive capability.

During the high to low transition of the output at node 44, the output node 44 has four impedance states. 1) The initial turn-on of transistor 20. 2) Then the turn-on of transistor 24. 3) The gradual increase in impedance of transistor 24 due to the coupling to the output node 44 by transistor 23. 4) The full-strength drive of transistor 24 after the output voltage falls below the threshold of inverter 36.

When input node 38 goes from a low voltage to a high voltage, node 48 transitions to a low voltage. Simultaneously, the high voltage at node 38 turns off transistor 29 which removes the drive from transistor 24. This also turns on transistor 22 which pulls the charge off the gate of transistor 24 and eliminates any through current path. This reduces the power dissipation requirements of the device by minimizing the time that the output pull up transistor 27 (high side transistor), and the output pull down transistor 24 are turned on simultaneously. With transistor 27 on, output node 44 is pulled high. Now the feedback path 58 toggles the transmission gate 50 to the transfer mode, although at this point a low is being passed therefore transistor 23 is off and the output from node 44 is not coupled to the gate of transistor 24. The feedback path 58 also turns off transistor 28 thus removing all drive for transistor 24. Once again the transition is over and transistor 24 holds output node 44 in a high state. Although the low to high edge rate is not controlled in the circuit of FIG. 1, a complement of this circuit could be easily derived to control this transition.

Devices utilizing the circuit of FIG. 1 can have slow edge rates while maintaining fast propagation delays. These slow edge rates minimize current spikes into ground thus reducing the voltage fluctuation of the output. This reduction of current spikes also helps to reduce electromagnetic interference.

Figure 2:
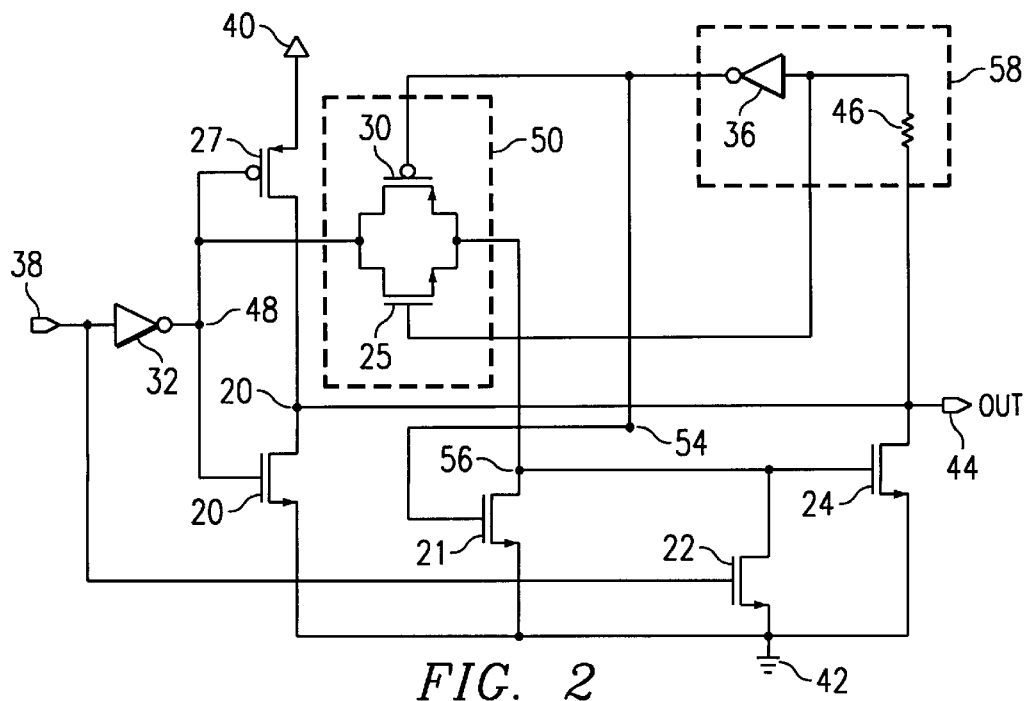
FIG. 2 is a schematic circuit diagram of an alternative embodiment output edge control circuit.

Shown in FIG. 2 is an alternative embodiment to the device of FIG. 1. In the circuit of FIG. 2, transistors 23, 28, and 29, and inverter 34, as shown in FIG. 1, have been removed. In the circuit of FIG. 2, transmission gate 50 is coupled directly to the gate of transistor 24, and node 54 is coupled to the output of inverter 36. The circuit of FIG. 2 removes some of the variable impedance features during the high to low transition of output node 44. The circuit of FIG.

2 has two impedance regions during the high to low transition of the output: the initial turn-on of transistor 20 followed by the turn-on of transistor 24. This makes the edge rate faster. The final state of transistor 24 is a high impedance state with low current drive capability.

Although the present invention has been described in detail, it should be understood that various changes, substitutions and alterations can be made without departing from the spirit and scope of the invention as defined by the appended claims. It is therefore intended that the appended claims encompass any such modifications or embodiments.

What is claimed is:

1. An output edge control circuit comprising:

a high side transistor coupled to an output node;

a first low side transistor coupled to the output node;

a second low side transistor coupled in parallel with the first low side transistor;

a coupling transistor coupled between the output node and a control node of the second low side transistor;

a transmission gate coupled between a control node of the first low side transistor and a control node of the coupling transistor; and feedback circuitry coupled between the output node and the transmission gate for controlling the transmission gate.

2. The device of claim 1 further comprising a first transistor coupled to the control node of the second low side transistor and a second transistor coupled between the first transistor and a supply node, a control node of the first transistor is coupled to an input node and a control node of the second transistor is coupled to the feedback circuitry.

3. The device of claim 2 further comprising a third transistor coupled between the control node of the coupling transistor and a ground node, a control node of the third transistor is coupled to the first transistor.

4. The device of claim 1 further comprising a transistor coupled between the control node of the second low side transistor and a ground node, a control node of the transistor is coupled to an input node.

5. The device of claim 1 wherein the transmission gate includes an NMOS transistor coupled in parallel with a PMOS transistor.

6. The device of claim 5 wherein the feedback circuitry includes a resistor coupled between the output node and a gate of the NMOS transistor, and an inverter coupled between the resistor and a gate of the PMOS transistor.

7. The device of claim 1 wherein the high side transistor is a PMOS transistor, the first low side transistor is an NMOS transistor, the second low side transistor is an NMOS transistor, and the coupling transistor is an NMOS transistor.

8. The device of claim 1 further comprising an inverter coupled between an input node and the control node of the first low side transistor.

9. An output edge control circuit comprising:

a high side transistor coupled to an output node;

a first low side transistor coupled to the output node, a control node of the first low side transistor is coupled to a control node of the high side transistor;

a second low side transistor coupled in parallel with the first low side transistor;

a coupling transistor coupled between the output node and a control node of the second low side transistor;

a transmission gate coupled between the control node of the first low side transistor and a control node of the coupling transistor;

feedback circuitry coupled between the output node and the transmission gate for controlling the transmission gate;

a first inverter coupled between an input node and the control node of the first low side transistor;

a first transistor coupled between the control node of the second low side transistor and a ground node, a control node of the first transistor is coupled to the input node;

a second transistor coupled to the control node of the second low side transistor, a control node of the second transistor is coupled to the input node;

a third transistor coupled between the second transistor and a supply node, a control node of the third transistor is coupled to the feedback circuitry through a second inverter; and a fourth transistor coupled between the control node of the coupling transistor and the ground node, a control node of the fourth transistor is coupled to the second transistor.

10. The circuit of claim 9 wherein the transmission gate includes an NMOS transistor coupled in parallel with a PMOS transistor.

11. The device of claim 10 wherein the feedback circuitry includes a resistor coupled between the output node and a gate of the NMOS transistor, and an inverter coupled between the resistor and a gate of the PMOS transistor.

12. The device of claim 9 wherein the high side transistor is a PMOS transistor, the second transistor is a PMOS transistor, the third transistor is a PMOS transistor, the first low side transistor is an NMOS transistor, the second low side transistor is an NMOS transistor, the coupling transistor is an NMOS transistor, the first transistor is an NMOS transistor, and the fourth transistor is an NMOS transistor.

13. An output edge control circuit comprising:

a high side transistor coupled to an output node;

a first low side transistor coupled to the output node;

a second low side transistor coupled in parallel with the first low side transistor;

a transmission gate coupled between a control node of the first low side transistor and a control node of the second low side transistor;

feedback circuitry coupled between the output node and the transmission gate for controlling the transmission gate;

a transistor coupled between the control node of the second low side transistor and a ground node, a control node of the transistor is coupled to the feedback circuitry; and a transistor coupled between the control node of the second low side transistor and a ground node, a control node of the transistor is coupled to an input node, an inverter is coupled between the input node and the control node of the first low side transistor.

* * * * *